United States Patent [19]
Low et al.

[11] Patent Number: 6,040,632
[45] Date of Patent: Mar. 21, 2000

[54] MULTIPLE SIZED DIE

[75] Inventors: Qwai H. Low; Chok J. Chia, both of Cupertino; Seng-Sooi Lim, San Jose, all of Calif.

[73] Assignee: LSI Logic Corporation, Milpitas, Calif.

[21] Appl. No.: 09/006,784

[22] Filed: Jan. 14, 1998

[51] Int. Cl.[7] .................................................. H01L 27/10
[52] U.S. Cl. ........................... 257/784; 257/48; 257/202; 257/786; 257/620
[58] Field of Search .............................. 257/48, 202, 210, 257/620, 780, 781, 784, 786

[56] References Cited

U.S. PATENT DOCUMENTS

| | | | |
|---|---|---|---|
| 5,015,600 | 5/1991 | Livermore et al. | 438/462 |
| 5,016,080 | 5/1991 | Giannella | 357/45 |
| 5,285,082 | 2/1994 | Axer | 257/48 |
| 5,721,151 | 2/1998 | Padmanabhan et al. | 438/462 |
| 5,773,854 | 6/1998 | Pasch | 257/202 |
| 5,801,406 | 9/1998 | Lubow et al. | 257/202 |

FOREIGN PATENT DOCUMENTS 2-211648  8/1990  Japan .

*Primary Examiner*—Alexander Oscar Williams

[57] ABSTRACT

A multiple-sized integrated circuit (IC) die and a method of making a multiple-sized IC die includes forming a plurality of IC dies on a semiconductor wafer. Each IC die has multiple rows of bonding pads around its periphery. Adjacent bonding pads on separate rows of each IC die are electrically connected together so that attachment to any one of the connected bond pads yields the same result. A plurality of scribe streets separate each IC die on the wafer, with the scribe street defining the width between each IC die. Rows of bonding pads reside in the scribe street area. Different rows of bonding pads may be selectively removed from the IC die by scribing the wafer so as to include one or more of the rows of bonding pads, thereby allowing one IC die design to have multiple sizes. An IC die separated from the wafer may still be sized smaller as long as there remain at least two rows of bonding pads around the periphery.

6 Claims, 2 Drawing Sheets

MULTIPLE SIZED DIE

BACKGROUND OF THE INVENTION

The present invention relates to integrated circuit (IC) dies, and more particularly to designing an IC die having multiple rows of bond pads around its periphery, thereby enabling the die to be cut or scribed from the silicon wafer on which it is formed in multiple sizes.

In the last few decades, the electronics industry has literally transformed the world. Electronic products are used by, or affect the daily lives of, a large segment of the world's population. For example, telephones, television, radios, Personal Computers (PCs), laptop PCs, palmtop PCs, PCs with built-in portable phones, cellular phones, wireless phones, pagers, modems, and video camcorders, are just a few of the electronic products that have been developed in recent years and which have been made smaller and more compact, while providing more and/or enhanced functions than ever before. The integrated circuit (IC) die or IC chip, and the more efficient packaging of the IC die, have played a key role in the success of these products.

All of the devices listed above use many different size integrated circuit (IC) packages. The size of the IC die is determined in large part by the type of IC package in which the IC die is to be used. In most cases, the smallest IC die size is designed to reduce the cost of fabrication of the device.

There are four distinct stages in the manufacture of an IC die. The first stage is the material preparation. In this stage, the raw materials are mined and purified to meet semiconductor standards. The second stage consists of forming the material into wafers. The diameters of the wafers can vary between 1 and 12 inches. In the third stage, wafer fabrication, the IC dies are formed in and on the wafer. Up to several thousand identical devices can be formed on a single wafer, but typically 200 to 300 are more common. The area on the wafer occupied by the discrete device is called an IC die. Once the IC die has been formed on the silicon wafer, the wafer is cut or scribed to form the individual IC dies. In stage four, the IC die is housed or mounted within an individual protective package. Frequently, the IC die may be mounted with other components in a hybrid or multichip modules. Alternately, the IC die may be connected directly into a printed circuit board or other substrate to be used in an electronic device.

FIG. 1 shows a portion of a plan view of a wafer 100 having multiple IC dies formed thereon that is an example of the prior art structure of a typical IC die design. Typically, many IC dies 110 are formed on the wafer 100 using conventional technology. The IC electronic components (e.g., transistors and connector traces) are concentrated in the center of the IC die 110 and bond pads 120 are located on the periphery of the IC die 110 for connection to an IC package. There may be hundreds of IC dies 110 formed on a single wafer 100. The individual IC dies 110 are separated from each other on the wafer 100 by an area called a scribe street 130 or avenue. On either side of the scribe street 130 are scribe lines 140, also called saw lines. These scribe lines 140 also define the periphery of the individual IC die 110 once it is cut from the wafer 100. In current practice, the scribe street 130 is blank. This traditional design results in an IC die 110 of a particular size, determined by the design of the IC package and the fabrication technology.

Sometimes the need arises to alter the IC die size. For example, the electronic device with which the IC package is to be used may need to alter its performance parameters necessitating a change in the size of the die. In some cases, the IC die size is determined by the number of bond pads needed to connect to the IC package and the required spacing of the bond pads. In all cases, once the IC die size has been determined in the design stage, further changes in the IC die size result in a costly redesign process, effectively starting a new design process from the beginning. As a result, once the IC die is designed, changes cannot be made without re-designing and re-tooling. The IC die designer can use existing IC die sizes, but since the IC package size is set, the IC die may not be optimum. A fixed IC package size does not allow the IC die designer to evaluate the different options for optimized performance or cost savings without going to multiple designs and long fabrication cycle times.

Each IC device manufacturer typically has a preferred IC die design. In current practice, the IC package is optimized for a particular IC die, with the appropriate connection for the best performance of the device. The package is usually designed, tooled and manufactured before the IC die can be packaged.

In cases where an IC die is to be packaged in several different sized IC packages, the IC die has to be sized to fit all of the different options, which may increase the cost of the IC die and make the IC die incompatible with other IC packages. Also, when advances in the IC package technology result in a potential smaller-sized IC die, either the IC package or the IC die has to be redesigned or retooled in order to use the smaller IC die.

An assembly manufacturer may service different customers with different IC die sizes. However, this currently requires that the manufacturer design and stock several different IC packages for each of the different IC dies for their customers. Such multiple die/package stocking can be expensive.

In view of the above, it is evident that what is needed is an IC die design and wafer fabrication method that allows flexibility for different sized IC dies to be manufactured from the same wafer, allowing for multiple-sized IC dies to be used that are adaptable to different IC packages, thereby reducing the fabrication cycle time for new designs and making the design and implementation of different IC packages more cost effective.

SUMMARY OF THE INVENTION

The present invention addresses the above and other needs by providing an integrated circuit (IC) die that may be fabricated on a wafer along with a host of other IC dies; and once formed, be cut into multiple sizes. Advantageously, such multiple-sized die allows the same IC die to be used in a wide variety of different IC packages of various types and sizes.

Presently, when IC dies are formed on wafers, the IC die is designed with a fixed size having one row of bonding pads located around the periphery of the IC die. Disadvantageously, once the IC die is designed and fabricated on the surface of the wafer, any changes in IC die size requires a new design. Because of the fixed size of the IC die, the manufacturers are limited in IC packaging flexibility and new designs require long fabrication cycle times, thus increasing costs.

In contrast to the prior art method of forming IC dies, the present invention allows the manufacturer the flexibility to design an IC die that can be fabricated in multiple sizes from the same wafer and be adaptable to different IC packages. Advantageously, the present invention reduces fabrication cycle time, allowing the manufacturer to develop new products more quickly and at less expense that has heretofore been possible.

The multiple-sized IC die of the present invention is manufactured on a wafer. Many IC dies are formed on the surface of the same wafer. Around the periphery of each of the IC dies are bonding pads. While traditional designs have one row of bonding pads around the periphery of the IC die, the present invention has multiple rows of redundant bonding pads around the periphery. Adjacent bonding pads on separate rows of each IC die are electrically connected to each other so that attachment to any one of the connected pads yields the same electrical connection. The IC dies are fabricated on the wafer with an area between them. The area between the IC dies is called a scribe street. In the traditional design, the scribe street is left blank. In the present invention the additional rows of bonding pads extend into the scribe street area. Many scribe lines are on the scribe street. The scribe lines are positioned between the rows of bonding pads. When the die is cut from the wafer, any one of the scribe lines is selected so as to remove none, one, or more of the redundant rows of bonding pads from the IC die, thereby allowing one IC die design to have multiple sizes. Once the IC die is separated from the wafer, it is still capable of being sized smaller, if necessary, as long as there are multiple rows of bonding pads around the periphery that can be removed through a scribing process.

BRIEF DESCRIPTION OF THE DRAWINGS

The above and other aspects, features and advantages of the present invention will be more apparent from the following more particular description thereof, presented in conjunction with the following drawings wherein.

Below is a list of reference numbers associated with the figures.

| No. | Component |
| --- | --- |
| 10 | Wafer |
| 20 | Integrated Circuit Die |
| 30 | Scribe Street |
| 40 | Scribe lines |
| 50 | Bonding Pads |
| 60 | Optional Scribe Lines |
| 70 | Center Scribe Line |
| 100 | Wafer (prior art) |
| 110 | Integrated Circuit Die (prior art) |
| 120 | Bond Pads |
| 130 | Scribe Street |
| 140 | Scribe Lines |

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
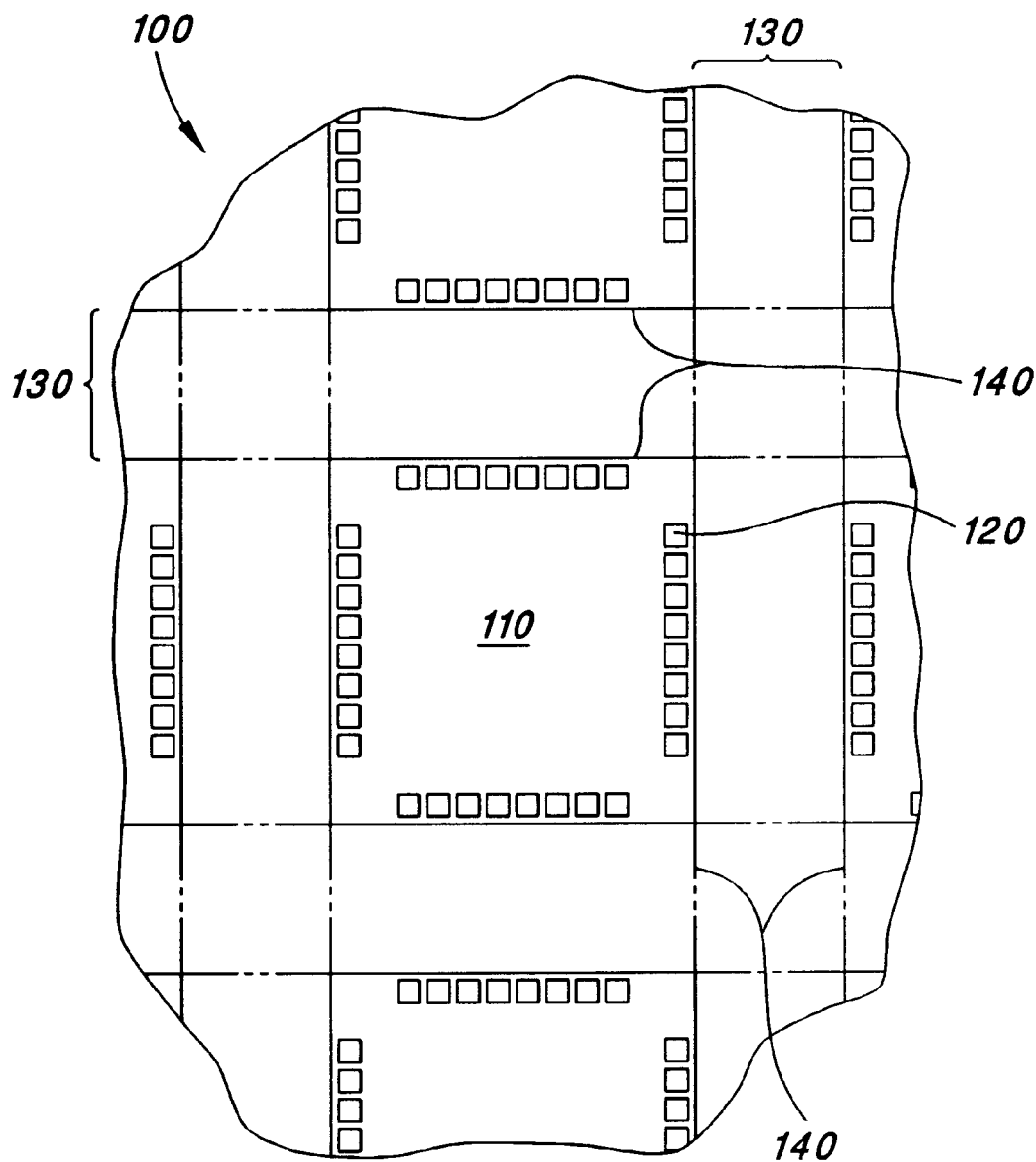
FIG. 1 is a plan view of a portion of the surface of a semiconductor wafer showing the conventional manner in which IC dies are formed thereon.

FIG. 1 illustrates a prior art device and has been described in the background of the invention.

Figure 2:
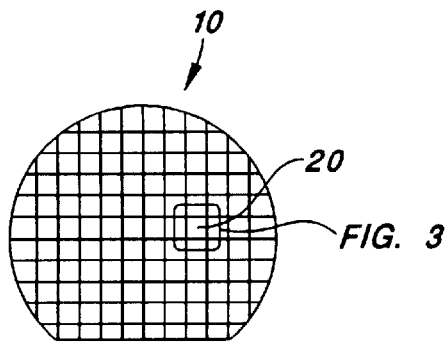
FIG. 2 is a plan view of a semiconductor wafer showing the formation of integrated circuit dies thereon.

FIG. 2 shows a silicone wafer 10 with many IC dies 20 formed on the wafer 10.

Figure 3:
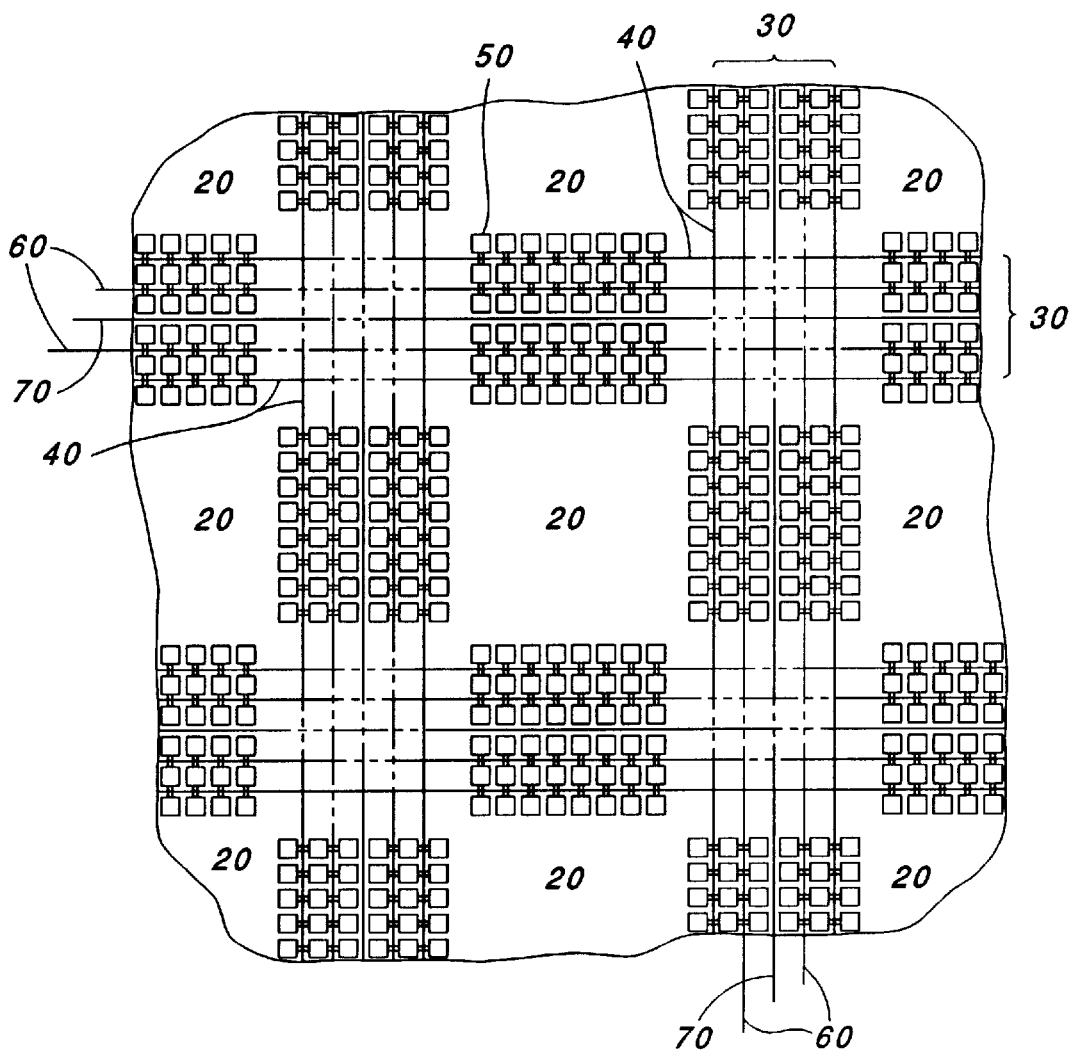
FIG. 3 is an enlarged view of a portion of FIG. 2 showing the formation of multiple-sized die in accordance with the present invention.

FIG. 3 is an enlarged area of FIG. 2 showing the present invention. In the present invention, as shown in FIG. 3, the IC dies 20 are formed on the wafer 10 with conventional technology. The structure of the circuitry formed on the IC die 20 is generally concentrated in the center of the IC die 20, leaving the periphery of the die open or vacant of such circuitry. The electronic circuitry for the IC die 20 has been omitted for clarity in the figures but typically includes many electronic components, such as transistors, resistors, traces, etc. In the available space around the periphery of the die 20, there is a plurality of bonding pads 50. These bonding pads 50 facilitate connection to an IC package (not shown).

There are many IC dies 20 formed on the wafer 10. The area separating each IC die 20 is called the scribe street 30. In current practice, the scribe street 30 is blank. Traditionally, as seen in FIG. 1, the IC die has one row of bonding pads around the periphery, adjacent the scribe street, e.g. there is one row of bonding pads on each side of the IC die. In contrast, in the present invention, multiple rows of bonding pads 50 are placed around the periphery of the IC die 20. The rows of bonding pads 50 spaced some distance apart and extend into the area of the scribe street 30. For illustration purposes only, the IC die 20 in FIG. 3 has three rows of bonding pads 50, with each row having eight bonding pads, along each side of the die. Depending on the IC die requirements, there could be more or less bonding pads 50 or rows on each IC die 20.

On either side of the scribe street 30 are scribe lines 40. The scribe lines 40 are used as guides for cutting the wafer 10 and the scribe lines 40 also define the periphery of each IC die 20. To separate the wafer 10 into individual IC dies 20 requires the alignment of the wafer 10 on a precision stage and scribing the center of the scribe lines 40 with a diamond tipped scribe or saw. After scribing, the wafer 10 separates along the scribe lines 40, separating each IC die 20 from the wafer 10.

Advantageously, the present invention allows the IC dies to be separated along more than one scribe line. FIG. 3 shows the scribe line 40 along with optional scribe lines 60 that may be used. The optional scribe lines 60 are parallel to the scribe lines 40 but are located in the scribe street 30 so as to include an additional row of bonding pads 50. Once it is determined what the final size of the IC die 20 should be, the manufacturer chooses which scribe line 40 or 60 to cut along to obtain the correct size for the IC die 20.

As indicated, the present invention electrically connects adjacent bonding pads 50 on different rows to each other. Connecting the bonding pads 50 of one row to the adjacent bonding pad 50 of the next row means that each of the electrically connected bonding pads 50 will perform the same function, no matter which bonding pad 50 is connected to the IC package. Thus, once the IC die 20 is separated from the wafer 10, it is used in the same manner as a traditional IC die, i.e., once the multiple sized IC dies 20 are separated from the wafer, they will perform the same function as current IC dies, but (depending upon which scribe line is used) may assume a different size.

The rows of bonding pads 50 are spaced apart to allow a scribe or saw to go between them. By altering which scribe line 40 or 60 is used, multiple sized IC dies 20 can be made from the same wafer 10. FIG. 3 illustrates three rows of bonding pads 50 on each side of the IC die 20. Depending on the IC die requirements, there could be many rows of bonding pads 50 on the IC die 20 and each side of the IC die

20 could also have a different number of rows. For example, the first row of bonding pads 50 on a IC die 20 could be located on a square of 4 millimeters, the next row on a square of 6 millimeters, the next on 8 millimeters and so on up to 12 millimeters. The IC die 20 can then be sized from 4.5 millimeters to 12.5 millimeters, depending on which row of bonding pads 50 is selected. The size of the IC die 20 may then be determined at the wafer 10 dicing operation, allowing one wafer 10 to supply many different sized IC dies 20.

An alternative embodiment of the present invention is to cut all of the IC dies 20 along a center scribe line 70 between the IC die so that each separated IC die 20 has multiple rows of bonding pads 50 around its periphery. Doing this allows the manufacturer, in a subsequent operation, to trim the IC die 20 along any row of bonding pads 50 to resize the IC die 20. Thus, one multiple sized IC die 20 design can be used with many different sized packages and future packages.

Use of the present invention by the manufacturer allows custom integrated circuit designs, with the IC die size requirements programmed in at the wafer cutting, with almost no tooling cost or additional lead-time for each specific design. The ability to quickly change the IC die size allows for flexible IC die designs which allow changes to be made to improve the designs with fast cycle times.

While the invention herein disclosed has been described by means of specific embodiments and applications thereof, numerous modifications and variations could be made thereto by those skilled in the art without departing from the scope of the invention set forth in the claims.

What is claimed is:

1. A wafer on which multiple-sized integrated circuit (IC) dies are formed comprising:
   (a) a wafer;
   (b) a plurality of IC dies formed on the wafer, each IC die having a periphery;
   (c) multiple rows of bonding pads located near and along the periphery of each IC die, adjacent bonding pads on separate rows of each IC die being electrically connected to each other; and
   (d) a plurality of scribe lines positioned between the multiple rows of bonding pads whereby each scribe line defines a different IC die size.

2. The wafer on which multiple-sized integrated circuit (IC) dies are formed of claim 1 further including scribe streets separating each IC die on the wafer, each scribe street having a width that defines the width between adjacent IC dies, and wherein at least one of the multiple rows of bonding pads resides in the scribe street.

3. The wafer of claim 2 wherein at least two of the multiple rows of bonding pads reside in the scribe street.

4. A multiple-sized integrated circuit (IC) die comprising:
   a logic area having a periphery;
   multiple rows of bonding pads, the bonding pads located near and along the periphery of the logic area;
   adjacent bonding pads on different ones of the multiple rows being electrically coupled to one another; and
   a plurality of scribe lines each at a periphery of respective ones of said multiple rows of bonding pads, whereby each of the plurality of scribe lines defines a different integrated circuit die size.

5. The multiple-sized integrated circuit (IC) die of claim 4 further including:
   a scribe street area located near and along the periphery of said logic area, wherein at least one of said multiple rows of bonding pads resides in the scribe street area.

6. The multiple-sized integrated circuit (IC) die of claim 5 wherein at least two of said multiple rows of bonding pads reside in said scribe street area.

* * * * *